(12) United States Patent
Chang

(10) Patent No.: US 8,178,287 B2
(45) Date of Patent: May 15, 2012

(54) PHOTORESIST COMPOSITION AND METHOD OF FORMING A RESIST PATTERN

(75) Inventor: Ching-Yu Chang, Yilang County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/677,089

(22) Filed: Feb. 21, 2007

(65) Prior Publication Data

US 2008/0063976 A1  Mar. 13, 2008

Related U.S. Application Data

(60) Provisional application No. 60/825,041, filed on Sep. 8, 2006.

(51) Int. Cl.
*G03F 7/26* (2006.01)
*H01L 21/027* (2006.01)

(52) U.S. Cl. .......... 430/316; 430/323; 430/329

(58) Field of Classification Search .......... 430/270.1, 430/271.1, 276.1, 310, 316, 323, 312, 329
See application file for complete search history.

(56) References Cited

U.S. PATENT DOCUMENTS

| | | | | |
|---|---|---|---|---|
| 4,394,434 | A * | 7/1983 | Rohloff | 430/270.1 |
| 4,994,348 | A * | 2/1991 | Raabe et al. | 430/287.1 |
| 5,426,073 | A * | 6/1995 | Imaoka et al. | 438/597 |
| 6,087,064 | A * | 7/2000 | Lin et al. | 430/270.1 |
| 6,210,856 | B1 * | 4/2001 | Lin et al. | 430/270.1 |
| 6,475,892 | B1 * | 11/2002 | Bhakta | 438/585 |
| 6,994,946 | B2 | 2/2006 | Hatakeyama et al. | |
| 2004/0017297 | A1 * | 1/2004 | Chen et al. | 340/606 |
| 2004/0067616 | A1 * | 4/2004 | Hachisuka et al. | 438/241 |
| 2004/0126715 | A1 * | 7/2004 | Larson et al. | 430/325 |
| 2005/0214674 | A1 | 9/2005 | Sui et al. | |
| 2006/0063105 | A1 | 3/2006 | Oberlander et al. | |
| 2007/0148557 | A1 * | 6/2007 | Takei et al. | 430/4 |

FOREIGN PATENT DOCUMENTS

WO  WO 2005/064403 A1 *  7/2005

* cited by examiner

*Primary Examiner* — Anca Eoff
(74) *Attorney, Agent, or Firm* — Haynes and Boone, LLP

(57) ABSTRACT

A resist material utilized in photolithography patterning includes a first material, and a second material dispersed in the first material. The second material is capable of diffusing to a top surface of the resist material, and has an etch rate different from that of the first material.

18 Claims, 3 Drawing Sheets

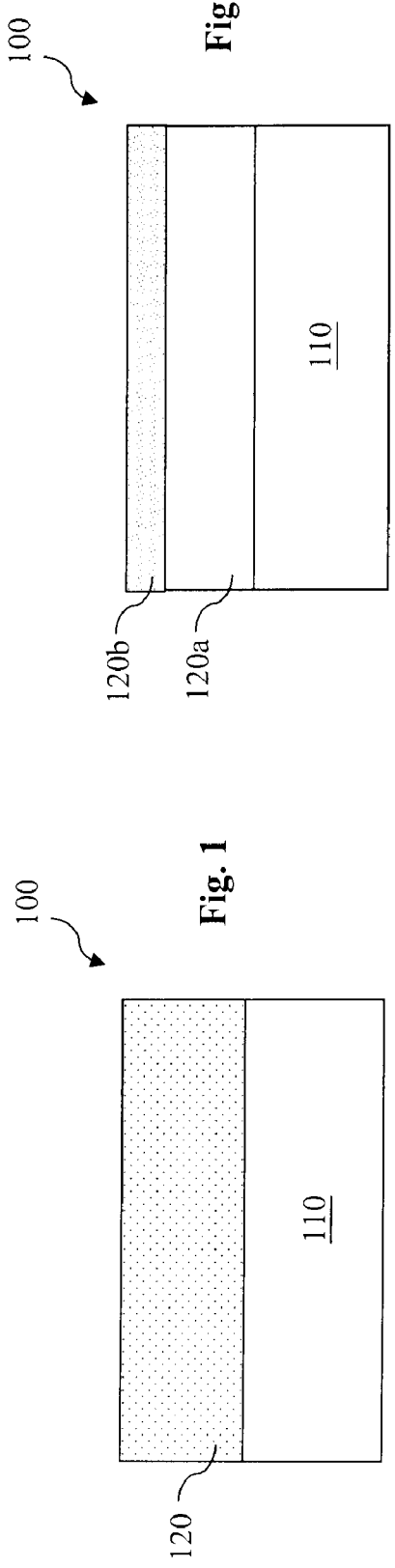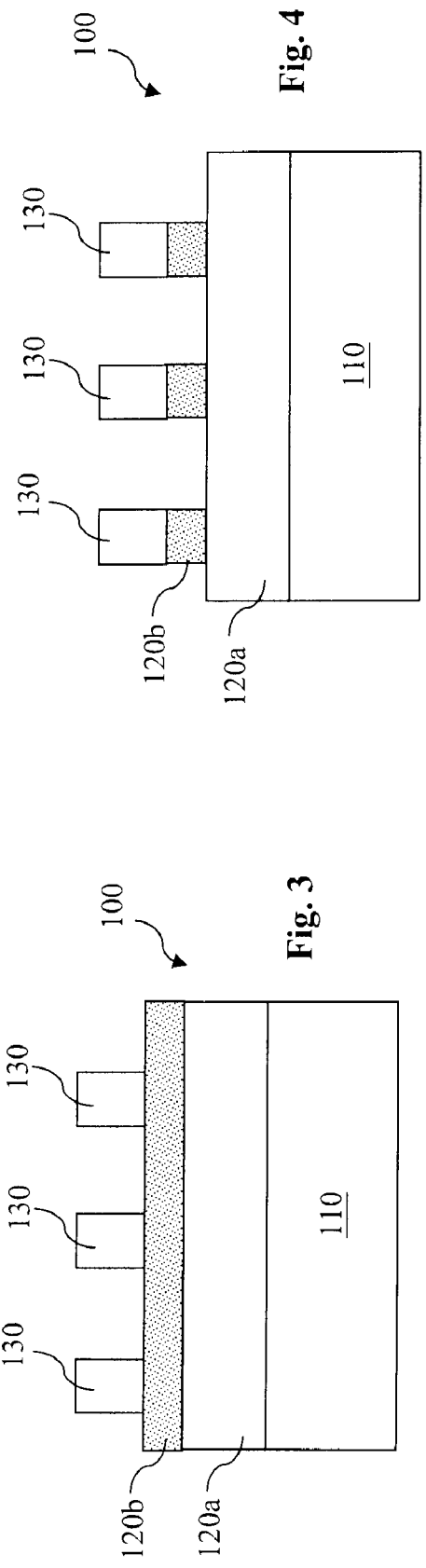

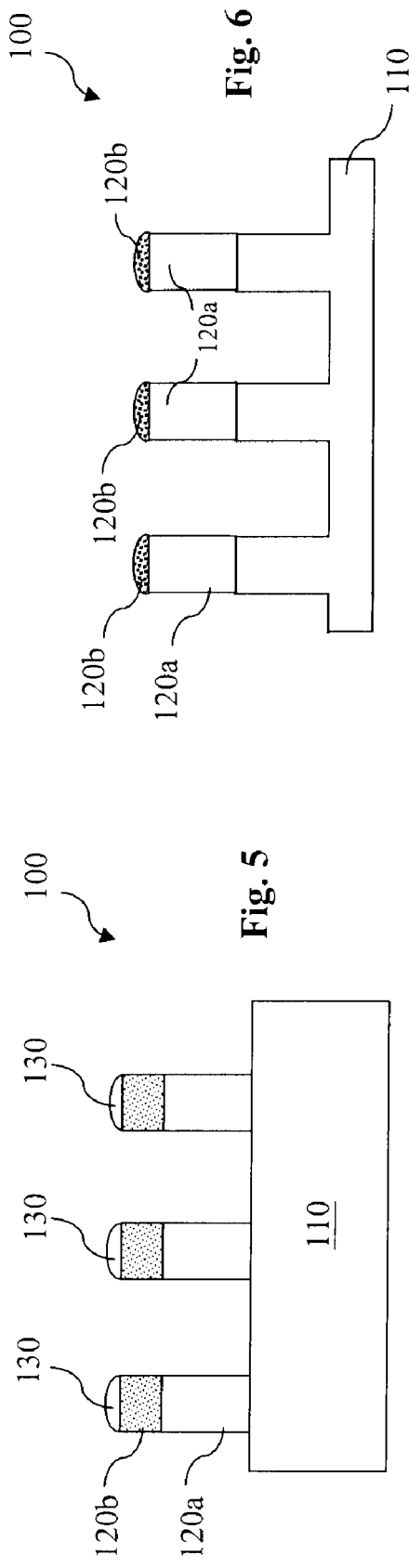

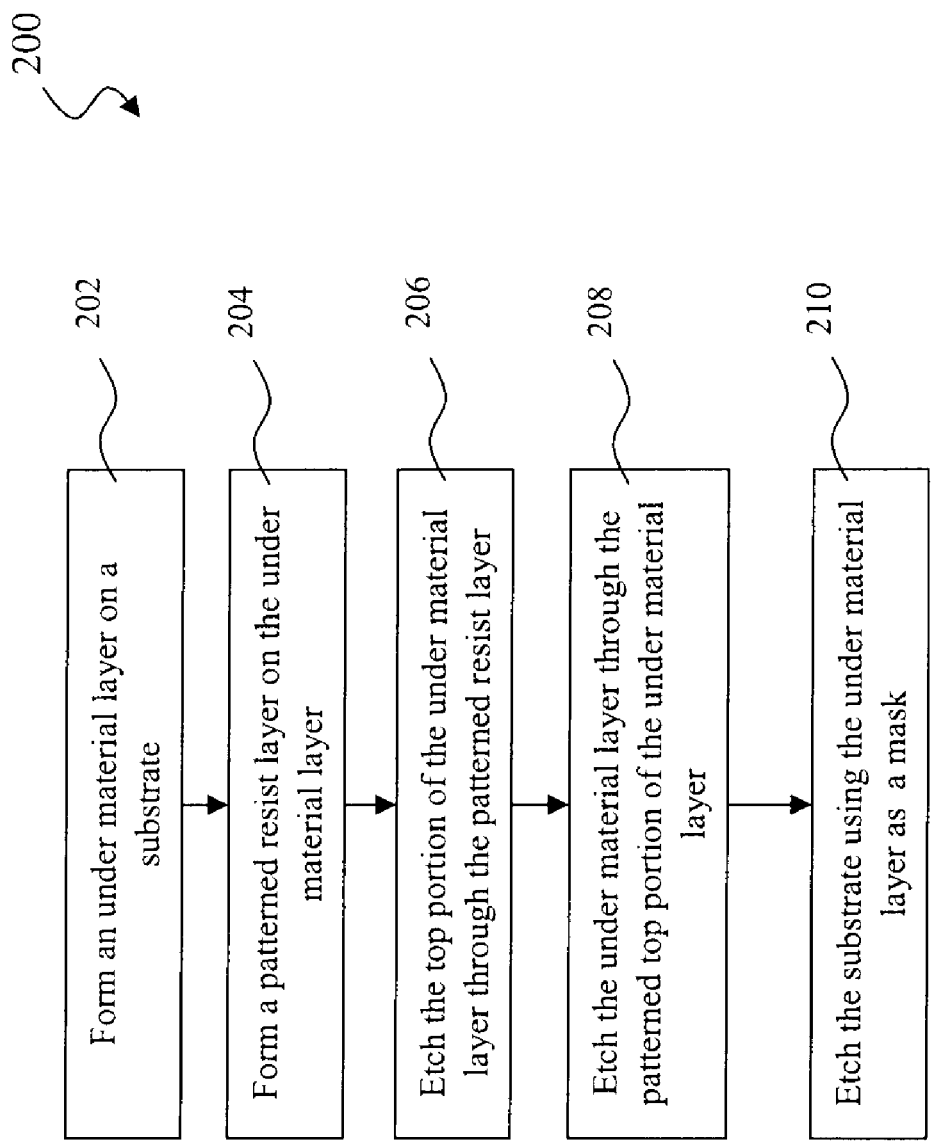

PHOTORESIST COMPOSITION AND METHOD OF FORMING A RESIST PATTERN

CROSS REFERENCES

This application claims priority from U.S. Provisional Patent Application Ser. No. 60/825,041 filed on Sep. 8, 2006, entitled "PHOTORESIST COMPOSITION AND METHOD OF FORMING A RESIST PATTERN". The present disclosure is related to the following commonly-assigned U.S. patent application, the entire disclosure of which is hereby incorporated herein by reference: U.S. patent application Ser. No. 11/426,233, entitled "METHOD FOR FORMING A LITHOGRAPHY PATTERN" having Chin-Hsiang Lin and Ching-Yu Chang named as inventors.

BACKGROUND

Semiconductor technologies are continually progressing to smaller feature sizes, down to 65 nanometers, 45 nanometers, and below. A patterned photoresist layer used to produce such small feature sizes typically has a high aspect ratio. Maintaining a desired critical dimension (CD) can be very difficult for various reasons. For example, to keep a high etching resistance, a thick resist layer is usually utilized. However, a photoresist layer with a high thickness may suffer from pattern collapse.

BRIEF DESCRIPTION OF THE DRAWINGS

Aspects of the present disclosure are best understood from the following detailed description when read in conjunction with the accompanying figures. It is noted that, in accordance with the standard practice in the industry, various features are not drawn to scale. In fact, the dimensions of various features may be arbitrarily increased or reduced for clarity of discussion.

FIGS. 1, 2, 3, 4, 5, 6, and 7 are sectional side views of one embodiment of a substrate, during various fabrication stages.

FIG. 8 is a flowchart showing one embodiment of a method of lithography patterning.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIGS. 1-7 are sectional side views showing one embodiment of a substrate 100 during various successive fabrication stages. With reference to FIGS. 1-7, a method and an etch resist material utilized for lithography patterning are described.

FIG. 1 discloses a semiconductor device 100 having a silicon substrate 110. The substrate 110 may alternatively be made of other suitable semiconductor material, including Ge, SiGe, or GaAs. Further, the substrate 110 may be made of another suitable elementary semiconductor such as diamond; a suitable compound semiconductor such as silicon carbide, indium arsenide, or indium phosphide; or a suitable alloy semiconductor such as silicon germanium carbide, gallium arsenic phosphide, or gallium indium phosphide. The substrate 110 may include various doped regions, dielectric features, and multilevel interconnects. The substrate 110 may alternatively be a non-semiconductor material, such as a glass substrate for thin-film-transistor liquid crystal display (TFT-LCD) devices, or fused quartz or calcium fluoride for a photomask (mask or reticle). The substrate 110 may include one or more other material layers to be patterned, such as a polysilicon layer, a conductive layer, a dielectric layer, or multiple layers of various materials.

An under material layer (or "etch resist" layer or simply "material" or "resist" layer) 120 is formed on the substrate 110. The material layer 120 may function as a hard mask in patterning the substrate. The material layer 120 may have additional functions, such as serving as a bottom anti-reflective coating (BARC). The material layer 120 has a thickness ranging between about 50 angstroms and 9000 angstroms. In another embodiment, the material layer 120 has a thickness ranging between about 1000 angstroms and about 3500 angstroms. For example, the thickness of the material layer 120 can be about 3000 angstroms. Further, the material layer 120 may include other parameters designed in proper ranges.

In the present embodiment, the material layer 120 includes a first material as a matrix. The first material includes an organic polymer, and may be substantially free of silicon and/or substantially free of metals. Alternatively, the first material may include a silicon containing material. The first material may include a photoresist that is either a positive-type or a negative-type photoresist, with or without photosensitive material. For example, the first material includes I-line, G-line, KrF, ArF photoresist polymer backbone, or a non-photo-sensitive polymer. The first material may include a proper BARC material. The first material may include a conventional polymer material or a resist material. For example, the first material may be one of t-Butyloxycarbonyl (t-BOC) resist, acetal resist, and environmentally stabilized chemically amplified photoresist (ESCAP), which are known in the art. The polymeric material used in the first material may be cross-linked. For example, the polymeric material can be spin-on coated to the substrate 110 and then cross-linked using a baking process with temperature ranging between about 90 C and 300 C (or between about 100 C and 180 C in an alternative embodiment). The polymeric material may alternatively be non cross-linked, and then the material layer 120 may use a solvent that is incapable of dissolving a photoresist layer formed above the material layer 120. For example, the material layer 120 may use a butanol solvent. The first material may alternatively include an inorganic material. In various embodiments, the inorganic material of the first material includes carbide, silicon carbide, silicon nitride, or combinations thereof.

The material layer 120 includes a second material dispersed in the first material. The second material is capable of diffusing to the upper surface (or top surface) of the material layer 120 after it is applied to the substrate 110, resulting in a thin layer (or top portion) 120b in which the second material aggregates, and also a main portion 120a underlying the top portion, as illustrated in FIG. 2. The second material may be redistributed partially or substantially to the top portion through various mechanisms, also referred to as diffusion, aggregation, or separation. In one embodiment, the second material has a lower molecular weight relative to the first material, and is thus diffusible to the upper surface such that the top portion has a higher density of the second material than the main portion does. For example, the first material may have an average molecular weight higher than about 7000 Dalton, while the second material has an average molecular weight about 2000 Dalton or less. In another embodiment, the second material has a different polarity relative to the first material or the solvent. For example, when the first material has a lower polarity in relation to the second material, the second material will separate during a thermal baking process. In another embodiment, when the second material has a hydrophilic/hydrophobic ratio different from that of the first material, they will have different solubilities to the solvent or to each other. The second material will separate from the first material during a thermal baking process. In another embodiment, when the second material is chosen to have a solubility to the solvent that is higher than that of the first material, the second material can diffuse into the top portion of the material layer 120 along with the solvent, during a baking process. In a further embodiment, when the second material and the first material have different hydrogen bond or Van der Waal forces to the solvent or each other, the second material may also be separated from the first material during a baking process.

In the furtherance of embodiments, the separation of the second material from the first material may be utilized in various methods, including polarity difference. In one example, the first material is more hydrophobic than the second material, for example by including fewer polarity groups, OH, and/or COOH groups than the second material. The hydrophobic property of the first material has an additional benefit of enhanced adhesion to the substrate. The hydrophilic property of the second material provides a benefit of reduced defects on the surface of the material layer. At least one of the second material and first material may be capable of changing its surface contact angle after contacting a base solution. In one example, the base solution is a tetramethylammonium hydroxide (TMAH) solution with concentration about 2.38%. The second material may include alkyl alcohol, carboxylic, acid leaving group, lactone, and/or anhydride groups. The resulting hydrophobic surface may have a benefit of improved adhesion to a photoresist layer formed thereon. Alternatively, a resulting hydrophilic surface can reduce defects. In another example, the first material is more hydrophobic than the second material, for example by including fewer polarity groups, OH, and/or COOH groups than the second material. In furtherance of the example, the second material may include more fluoride polymer or organic polymer. The hydrophobic property of the second material has the additional benefits of enhanced adhesion to a photoresist layer disposed thereon, and reduced collapse issues.

Thus, the second material may be partially or substantially diffused to the top portion of the material layer 120 utilizing various mechanisms. The diffusion may occur at various stages after the second material has been applied to the substrate 110. In various embodiments, the diffusion may occur during a coating stage, during a baking stage, and/or before a hardening process. Through a heating process or a crosslinking process, the hardening process can be enhanced, and the diffusion is therefore enhanced too.

The second material has an etch resistance (or etch rate) different from that of the first material. The second material may include silicon and/or metal to enhance etch resistance. In one embodiment, the second material includes an organic polymer. The organic polymer utilized in the second material may have an Onishi number lower than that of the first material. The Onishi number is defined to correlate with etch rate due to energetic ion bombardment. The organic polymer of the second material includes double bond, and/or triple bond molecular in order to reduce the etch rate. The organic polymer of the second material may include a silicon-containing polymer. For example, the silicon-containing polymer in the second material may include silsesquioxane (SSQ) polymer. Another embodiment may include a —$SiR_2OSiR_2O$— group or a —$R_2SiSiR_2$— group. In yet another embodiment, the second material may include inorganic material. The inorganic material used in the second material may include a silicon-containing material, carbide, a metal-containing material, or combinations thereof. For example, the silicon-containing inorganic material may include silicon carbide, silicon oxide, and/or silicon nitride. The metal-containing inorganic material may include Ti, Al, Cu, Si, W, TiN, TaN, or combinations thereof. TiO2 is another example for the metal containing material.

The material layer 120 may additionally include a third material dispersed in the first material and diffusible to the top portion after being applied to the substrate 110. The mechanism to achieve diffusion of the third material to the top portion can be similar to one of the mechanisms for the second material described above. The third material may be designed to adjust or control surface properties of the material layer 120. For example, the third material may be designed as a control material to control density, acidity, adhesion, polarity, molecular uptake, molecular leaching, hydrophobic/hydrophilic property, solubility (to a developer), molecular reactions, light diffraction, light absorption, and/or acidity/basisity.

In one embodiment, the third material includes a lower n value (light diffraction value) polymer. The lower n value polymer in the material layer 120 may reduce photoresist standing wave introduced by a high reflection from the interface between the material layer 120 and photoresist. In another embodiment, the third material includes photo acid generator (PAG). The PAG in the material layer 120 may reduce photoresist scum introduced from a photoresist layer formed thereon. The PAG in the material layer 120 has a concentration ranging from about 0.01% to about 5%. Other examples of the third material includes TPS plus C3 ($C_3F_7SO_3$—), C4 ($C_4F_9SO_3$—), or C5 ($C_5H_{11}SO_3$—). In another embodiment, the third material includes cromophore. The surface cromophore can be evaporated during a baking process, washed away during a photoresist coating process, or washed away with the solution. Examples of the solution include de-ionized (DI) water, acid, base, or solvent solution. In other embodiments, the third material may include a carboxylic polymer with a possible reaction such as RCOOH+OH—→RCOO—+H2O; an acid sensitive leaving group with a possible reaction such as RCOOR1+H+→RCOO—; a fluoride polymer with a possible reaction such as RC(CF3)2OH+OH—→RC(CF3)2O— or —[C2HxFy]- polymer unit with $0 \leq x \leq 3$, $1 \leq y \leq 4$; or a hydroxyl-containing polymer with a possible reaction such as ROH+OH—→RO—. In another embodiment, the third material may include lactones or an anhydride-containing polymer with a possible reaction such as RCOOR1+OH1→RCOO—+R1OH. In other embodiments, the third material may include a small molecular polymer with molecular weight less than 7000 Dalton. Some of the examples discussed above include a functional group that is capable of switching its polymer from a more hydrophobic structure to a more hydrophilic structure after being contacted with a base solution. The switch polymer is rinsed away after a developing process. Some of the examples discussed about may include a structural or functional group that is capable of changing the surface density or hydrophobicity in order to modify the property of the interface between the material layer 120 and a resist layer (such as the patterned resist layer introduced below). For example, the fluoride polymer can increase the hydrophobicity of the surface and can increase the resist pattern adhesion and prevent from material uptake or leaching between the interfaces. The small molecular weight of the third material can also increase the surface density of the material layer 120 and prevent from material update or leaching in the interface.

In other embodiments, the third material may be combined into the second material, such that the second material can function both for tuning etch resistance and controlling surface properties of the material layer 120. The formation of the top portion 120b and the main portion 120a of the material layer 120 may occur during a baking process, during a process of coating on a photoresist layer, and/or during various processing stages of patterning the coated photoresist layer.

Referring to FIG. 3, a patterned resist layer 130 is formed on the material layer 120. Resist layer 130 includes a plurality of openings, such that portions of the material layer 120 are uncovered within the openings. The openings of the resist layer 130 are configured according to a pre-designed pattern. For example, a plurality of trenches can be formed in the substrate according to the openings. The resist layer 130 has a thickness ranging between about 50 angstroms and 5000 angstroms. In another embodiment, the resist layer 130 may have a thickness ranging between about 500 angstroms and 2000 angstroms. The resist layer 130 can be a positive-type or a negative-type resist. For advanced semiconductor patterning using an extreme ultra violet (EUV) radiation beam, the resist layer 130 may use a chemical amplification (CA) photoresist. The patterned photoresist layer 130 is formed by a lithography process that, in one embodiment, may include processing steps of resist coating, soft baking, mask aligning, exposing, post-exposure baking, developing, and hard baking. For example, the exposing process may be carried out by exposing the semiconductor device 100 with a radiation beam through a mask having a predefined pattern (or a reversed pattern). The radiation beam may be ultra-violet (UV) or extreme ultra-violet (EUV), such as a 248 nm beam from a Krypton Fluoride (KrF) excimer laser or a 193 nm beam from an Argon Fluoride (ArF) excimer laser. The lithography patterning may alternatively be implemented or replaced by other proper methods, such as maskless lithography, electron-beam writing, ion-beam writing, and molecular imprint. The patterned photoresist layer 130 may include an acid molecular or radiation-sensitive acid generator, such that acid can be generated when a radiation beam is applied.

Referring to FIG. 4, an etching process is applied to open the top portion 120b of the material layer, 120 such that the main portion 120a is exposed within the openings. The etching process may utilize a hydrofluorine (HF) solution or plasma gas to remove silicon-containing top portion 120b. The etching process may utilize another plasma gas to remove organic top portion 120b. For example, an oxygen plasma may be implemented to open the organic top portion if the main portion 120a is an inorganic silicon containing material. The top portion organic layer 120b may be used for adhesion improvement, material uptake and leaching improvement. The patterned photoresist layer 130 may be stripped after the top layer etching.

Referring to FIG. 5, the main portion 120a is etched using the patterned top portion 120b as a hard mask. For example, for the main portion that uses an organic polymer, a dry plasma etching with oxygen may be used to open the main portion 120a in order to transfer the openings from the top portion and expose the substrate 110 within the openings. The patterned photoresist layer 130 may be partially or totally consumed during this etching process, if it has not already been stripped before this process.

Referring to FIG. 6, the substrate 110 is opened under the patterned main portion 120a of the material layer 120 in order to form a plurality of trenches using a suitable etching process including a dry etching or a wet etching. The top portion 120b may be partially or totally consumed during this etching process to etch the substrate.

The material layer 120 is thereafter removed as illustrated in FIG. 7. During the above-described process, since the material layer 120 self-separates into the top portion 120b and the main portion 120a, the previously-used three-layer process can be eliminated, thereby reducing manufacturing cost, material cost, and fabrication cycle time. Other advantages may include material control such as tuned light absorption, adhesion and reduced scum.

FIG. 8 is a flowchart of an embodiment of a method 200 of lithography patterning as a further illustration of the lithography patterning described above with reference to FIGS. 1-7. The method 200 begins at step 202 by forming an under material layer (or resist layer) on a substrate, and may further include a baking process to enhance the separation of the under material layer, resulting in a top portion and a main portion that have different etch rates. The method 200 further includes step 204 to form a patterned resist layer on the under material layer. At step 206, the top portion is etched using the patterned resist layer as a mask. At step 208 the main portion is etched to transfer the openings from the top portion to the main portion, in order to thereby expose the substrate within the openings. At step 210 the substrate is etched using the main portion as a hard mask.

Various changes, substitutions and alterations can be made herein without departing from the spirit and scope of the present disclosure. For example, the second material may be diffusible to the bottom of the material layer 120. The third material may be diffusible to the bottom of the material with the second material or, alternatively, one of them may be diffusible to the top of the material layer 120 and the another diffusible to the bottom of the material layer 120. In another embodiment, one of the second and third materials may be diffusible to the top or the bottom, while the another remains its original distribution.

Thus, the present disclosure provides a resist material for lithography patterning. The resist material includes a first material; and a second material dispersed in the first material. The second material is capable of diffusing to a top portion of the resist material, and has a etch rate, density, hydrophilicity, hydrophobicity, and/or solubility different from those of the first material.

In this resist material, the second material may include a component selected from the group consisting of silicon, metal, and combinations thereof. The second material may include organic polymer. The organic polymer of the second material may further include a silicon-containing polymer. The silicon-containing polymer may include a silsesquioxane (SSQ) polymer. In other embodiments, the second material may include inorganic material. The inorganic material may include a component selected from the group consisting of a silicon-containing material, carbide, a metal-containing material, and combinations thereof. The metal-containing material of the inorganic material may include one element selected from the group consisting of Ti, Al, Cu, Si, W, TiN, TaN, and combinations thereof. The silicon-containing material of the inorganic material may include a material selected from the group consisting of silicon carbide, silicon oxide, silicon nitride, and combinations thereof.

In this resist material, the second material is capable of diffusing to the top surface of the resist material in various different ways, including molecular weight difference, polarity difference, hydrophilic difference, solubility difference, and combinations thereof in various embodiments.

The first material may be more hydrophobic than the second material. The first material may include fewer polarity groups, OH groups, or COOH groups than the second material. The second material or first material may be capable of changing its surface contact angle upon contacting with a base solution. The resist material may further include a third material capable of diffusing to the top surface of the resist material, where the third material includes photo acid generator (PAG). The third material may include PAG with a concentration ranging between about 0.01% and about 5%. The third material may be designed to enhance light absorption. The third material may be designed for surface control. The third material may use fluoride polymer, or a polymer with small molecular weight for examples. The first material may include an organic polymer.

The present disclosure also provides a method of forming an integrated circuit pattern. The method includes forming an under layer on a substrate wherein the under layer includes a material capable of diffusing to a top surface of the under layer (resulting in a top portion and a main portion of the under layer); forming a patterned photoresist layer on the under layer; etching the top portion of the under layer through the patterned photoresist layer; and thereafter etching the main portion of the under layer substantially through the patterned photoresist layer and the top portion.

This method may further include a baking process after the forming of the under layer. The method may include etching the substrate using the under layer as a hard mask after the etching of the main portion. The method may further include removing the under layer after the etching of the substrate. The forming of the patterned photoresist layer may include exposing the patterned resist layer utilizing a beam from a device selected from the group consisting of a Krypton Fluoride (KrF) excimer laser, an Argon Fluoride (ArF) excimer laser, an extreme ultraviolet (EUV) device, an imprint, an electron-beam, and combinations thereof.

The present disclosure also provides another embodiment of a resist material utilized in photolithography patterning. The resist material includes an organic polymer; and an additive dispersed in the organic polymer. The additive is capable of diffusing to a top portion of the resist material, resulting in a top portion, and a main portion underlying the top portion. In this resist material, the top portion may have an etch rate, diffraction, absorption, hydrophilicity, hydrophobicity, organic composition, and/or inorganic composition different from those of the main portion.

The foregoing has outlined features of several embodiments so that those skilled in the art may better understand the foregoing detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming a integrated circuit pattern, comprising:
    forming an under layer on a substrate wherein the under layer includes a first material capable of diffusing to a top surface of the under layer and providing etch resistance tuning for the under layer, and wherein the under layer includes a second material capable of diffusing to the top surface of the under layer and controlling top surface properties of the under layer;
    performing a first diffusion process, aggregation process or separation process to redistribute the first material of the under layer, resulting in a top portion and main portion of the under layer, the top portion and the main portion having different etching resistance;
    performing a second diffusion process, aggregation process or separation process to redistribute the second material of the under layer to the top surface of the under layer, thereby adjusting surface properties of the top surface of the under layer;
    forming a patterned photoresist layer on the under layer;
    etching the top portion of the under layer through the patterned photoresist layer;
    stopping the etching after patterning the top portion;
    thereafter removing the patterned photoresist layer from the substrate; and
    after removing the photoresist, etching the main portion of the under layer using the etched top portion as a masking element.

2. The method of claim 1, further comprising etching the substrate using the etched main portion of the under layer as a hard mask.

3. The method of claim 1, further comprising removing the under layer after the etching of the substrate.

4. The method of claim 1, wherein the forming of the patterned photoresist layer includes exposing a resist layer utilizing a means selected from a group consisting of Krypton Fluoride (KrF) excimer laser, Argon Fluoride (ArF) excimer laser, extreme ultraviolet (EUV), imprint, electron-beam, and combinations thereof.

5. The method of claim 1, wherein the first material capable of diffusing includes a component selected from the group consisting of silicon, metal, and combinations thereof.

6. The method of claim 1, wherein the first material capable of diffusing comprises organic polymer.

7. The method of claim 1, wherein the first material capable of diffusing comprises silsesquioxane (SSQ) polymer.

8. The method of claim 1, wherein the first material capable of diffusing includes an inorganic material component selected from the group consisting of a silicon containing material, carbide, a metal containing material, and combinations thereof.

9. The method of claim 1, wherein the forming the under layer on the substrate includes the first material capable of diffusing to the top surface of the under layer, wherein the diffusion is through one of mechanisms selected from the group consisting of molecular weight difference, polarity difference, hydrophilic difference, solubility difference, and combinations thereof.

10. The method of claim 1, wherein second material capable of diffusing to the top surface of the under layer includes a photo acid generator (PAG).

11. The method of claim 2, wherein the etching the substrate using the etched main portion consumes the etched top portion of the underlayer.

12. The method of claim 1, wherein the first material capable of diffusing comprises a metal.

13. The method of claim 1, wherein the first material capable of diffusing comprises a carbide.

14. The method of claim 1, wherein removing the patterned photoresist layer includes stripping the layer from the substrate.

15. A method of forming a integrated circuit pattern, the method comprising:
provi ding a substrate;
determining a composition of an under layer to form on the substrate, the determining the composition of the under layer includes;
determining a first material to use as a matrix for the under layer;
determining a second material to use as an etch resistance tuning material for the under layer, wherein the second material is chosen to diffuse to an upper portion of the under layer; and
determining a third material to use as surface property controlling material for the under layer, wherein the third material is chosen to diffuse to a top surface of the under layer;
forming the under layer on the substrate including the first material, the second material and the third material in the under layer;
performing a first diffusion process to diffuse the second material to the upper portion of the under layer, thereby resulting in the upper portion of the under layer and a lower portion of the under layer having a different etching resistance;
performing a second diffusion process to diffuse the third material the top surface of the under layer, thereby adjusting surface properties of the top surface of the under layer;
forming a patterned photoresist layer on the under layer;
etching the top portion of the under layer through the patterned photoresist layer;
stopping the etching after patterning the top portion;
thereafter removing the patterned photoresist layer from the substrate; and
after removing the photoresist, etching the main portion of the under layer using the etched top portion as a masking element.

16. The method of claim 15, further comprising:
providing an organic polymer as the first material.

17. The method of claim 15, wherein the determining the second material includes determining a difference between the first material and the second material, the difference based on one of the list consisting of a molecular weight difference, a polarity difference, a solubility difference, a hydrogen bond difference, and a Van der Waal force difference.

18. The method of claim 15, wherein the determining the third material includes assessing the third material for a material property in the list consisting of density, acidity, adhesion, polarity, molecular uptake, molecular leaching, hydrophobic property, hydrophilic property, solubility, molecular reaction, light diffraction, and light absorption.

* * * * *